United States Patent
Reid et al.

(10) Patent No.: US 8,043,967 B2
(45) Date of Patent: Oct. 25, 2011

(54) PROCESS FOR THROUGH SILICON VIA FILLING

(75) Inventors: Jonathan D. Reid, Sherwood, OR (US);
Katie Qun Wang, Portland, OR (US);
Mark J. Wiley, Portland, OR (US)

(73) Assignee: Novellus Systems, Inc., San Jose, CA (US)

(*) Notice: Subject to any disclaimer, the term of this patent is extended or adjusted under 35 U.S.C. 154(b) by 0 days.

(21) Appl. No.: 12/762,275

(22) Filed: Apr. 16, 2010

(65) Prior Publication Data

US 2010/0200412 A1    Aug. 12, 2010

Related U.S. Application Data

(63) Continuation of application No. 12/193,644, filed on Aug. 18, 2008, now Pat. No. 7,776,741.

(51) Int. Cl.
*H01L 21/44* (2006.01)
(52) U.S. Cl. ........ 438/678; 438/638; 438/687; 438/633; 257/E21.586
(58) Field of Classification Search .................. 438/633, 438/637, 638, 678, 687, FOR. 355, FOR. 489; 257/E21.586
See application file for complete search history.

(56) References Cited

U.S. PATENT DOCUMENTS

| | | | |
|---|---|---|---|
| 6,113,771 A | 9/2000 | Landau et al. | |
| 6,261,433 B1 | 7/2001 | Landau | |
| 6,350,366 B1 | 2/2002 | Landau et al. | |
| 7,670,950 B2 | 3/2010 | Richardson et al. | |
| 7,776,741 B2 | 8/2010 | Reid et al. | |
| 2003/0079683 A1* | 5/2003 | Nakano et al. | 118/400 |
| 2003/0106802 A1* | 6/2003 | Hagiwara et al. | 205/297 |
| 2003/0186540 A1* | 10/2003 | Ito et al. | 438/638 |
| 2010/0041226 A1 | 2/2010 | Reid et al. | |
| 2011/0083965 A1 | 4/2011 | Reid et al. | |

FOREIGN PATENT DOCUMENTS

| | | |
|---|---|---|
| JP | 09-223858 | 8/1997 |
| JP | 2003-113479 | 4/2003 |
| KR | 10-1999-0015599 | 3/1999 |
| KR | 10-2002-0077811 | 10/2002 |

OTHER PUBLICATIONS

Reid et al, "Electrolyte Concentration Control System for High Rate Electroplating", U.S. Appl. No. 12/577,619, filed Oct. 12, 2009.
U.S. Notice of Allowance and Allowed Claims for U.S. Appl. No. 12/193,644, mailed Jan. 28, 2010.
International Search Report and Written Opinion for PCT/US2009/054094, mailed Mar. 11, 2010.
U.S. Appl. No. 12/193,644, Notice of Allowance mailed May 3, 2010.

\* cited by examiner

*Primary Examiner* — Michelle Estrada
(74) *Attorney, Agent, or Firm* — Weaver Austin Villeneuve & Sampson LLP

(57) ABSTRACT

A semiconductor electroplating process deposits copper into the through silicon via hole to completely fill the through silicon via in a substantially void free is disclosed. The through silicon via may be more than about 3 micrometers in diameter and more that about 20 micrometers deep. High copper concentration and low acidity electroplating solution is used for deposition copper into the through silicon vias.

33 Claims, 8 Drawing Sheets

1 minute plating   2 minutes plating   3 minutes plating   4 minutes plating 1 minute plating    2 minutes plating    3 minutes plating    4 minutes plating

PROCESS FOR THROUGH SILICON VIA FILLING

CROSS-REFERENCE TO RELATED APPLICATIONS

This application is a continuation of and claims priority from U.S. patent application Ser. No. 12/193,644, filed on Aug. 18, 2008, now U.S. Pat. No. 7,776,741 entitled "PROCESS FOR THROUGH SILICON VIA FILLING," which is incorporated herein by reference in its entirety and for all purposes.

FIELD OF THE INVENTION

The present invention relates generally to methods and apparatus for depositing copper onto a wafer and more particularly to methods and apparatus for electroplating copper into through silicon vias having relatively large sizes and high aspect ratios that may interconnect stacked electronic devices.

BACKGROUND OF THE INVENTION

A through-silicon via (TSV) is a vertical electrical connection passing completely through a silicon wafer or die. TSV technology is important in creating 3D packages and 3D integrated circuits (IC). It provides interconnection of vertically aligned electronic devices through internal wiring that significantly reduces complexity and overall dimensions of a multi-chip electronic circuit.

A typical TSV process includes formation of TSV holes and deposition of a diffusion barrier layer and a conductive seed layer. A conductive material is then electroplated into TSV holes. Copper is typically used as the conductive material as it supports high current densities experienced at complex integration, such as 3D packages and 3D integrated circuits, and increased device speed. Furthermore, copper has good thermal conductivity and is available in a highly pure state.

TSV holes typically have high aspect ratios and depositing copper into such structures can be challenging. CVD deposition of copper requires complex and expensive precursors, while PVD deposition often results in voids and limited step coverage. Electroplating is a more common method of depositing copper into TSV structures; however, electroplating also presents a set of challenges because of the TSV's large size and high aspect ratio.

Typically, an electroplating solution for TSVs includes copper sulfate as a source of copper ions, sulfuric acid for controlling conductivity, copper chloride for nucleation of suppressor molecules, and several other additives. A standard copper plating bath with at least 10 grams per liter of sulfuric acid and about 40 grams per liter of copper ions are used. High acid content improves solution conductivity helping plated copper uniformly, but hydrogen ions significantly impede mobility of copper ions. Therefore, electroplating TSVs can take a very long time.

Accordingly, improved methods and apparatus to deposit conductive metals in TSV holes having large sizes and high aspect ratios are needed.

SUMMARY

The present invention provides copper electroplating methods and associated apparatus for electroplating copper in through silicon via (TSV) holes having large sizes and high aspect ratios. The plating solution for copper deposition inside the TSV holes may have a relatively low concentration of sulfuric acid and high concentration of copper ions. TSV deposition processes may benefit from faster copper migration through the plating solution and, in particular, to the bottom of the TSV hole. In certain embodiments, the plating solution may have very little or substantially no chloride ions. Further, the solution may be maintained at temperatures between about 40° C. and 75° C. to allow greater solubility of copper containing salts and thereby further improving the mobility of copper ions in the electroplating solution. Copper is electroplated into the TSV hole in a substantially void free manner and, in certain embodiments, over a period of less than about 20 minutes.

In certain embodiments, the method includes plating a TSV of at least 3 micrometers in diameter and at least 20 micrometers in depth. In a specific embodiment, a TSV may be between about 3 and 100 micrometers in diameter and between about 20 and 200 micrometers in depth. The TSV holes may have aspect ratio of between about 5:1 to 10:1.

The method may include contacting a structure having a TSV hole with a plating solution having a pH between about 2 and 6 and copper ions in a concentration of at least about 50 grams per liter. In a more specific embodiment, the plating solution has a pH between about 3 and 5. In one embodiment, the solution contains between about 40 grams per liter and 200 grams per liter of copper ions. In a more specific embodiment, the concentration of copper ions in the plating solution is between about 60 grams per liter and 100 grams per liter. The source of the copper ions may be copper methane sulfonate, copper sulfate, copper pyrophosphate, copper propanesulfonate, or a combination of thereof. Higher concentrations of copper ions and higher pH levels increase the copper transference number, which is contribution of copper ions to the total deposition current through the plating solution. In one embodiment, the copper ions in the plating bath have a transference number of at least about 0.2. In a more specific embodiment, the copper ions have a transference number of at least about 0.4.

In one embodiment, the plating solution includes an oxidizing agent at concentration levels that cause oxidation of the plated copper on a wafer field at a rate of between about 200 and 3000 Å/minute when current is not applied to the wafer. The oxidizing agent may be a solution of hydrogen peroxide, which may be added to the plating solution as 30% by weight hydrogen peroxide solution in the amounts ranging between about 0.0025 ml/l to 50 ml/L. In certain embodiments, elemental oxygen may be used as an oxidizing agent at, e.g., concentrations between about 1 and 20 mg/L. In a specific embodiment, the concentration of elemental oxygen in the plating solution may be between about 1 and 5 mg/L. Cerium or iron ions may be used as oxidizing agents as well. In one embodiment, the concentrations of the iron ions in different oxidation states, for example Fe(II) and Fe(III) are in equilibrium and such equilibrium is maintained by a reaction at the inert anode. Furthermore, the plating solution may include a reducing agent that has a concentration gradient in the through silicon via hole and that impacts oxidation of the copper.

As indicated, the solution may be kept at elevated temperatures; this improves copper salt solubility and copper ion mobility. In one embodiment, the plating solution has a temperature of between about 40° C. and 75° C. for at least a fraction of the time while plating copper into the through silicon via hole. In a more specific embodiment, the plating solution has a temperature of between about 50° C. and 70° C. Also as indicated, the plating solution may contain very little to no chloride ions. In one embodiment, the plating solution contains chloride ions in a concentration of not greater than about 50 ppm. In a more specific embodiment, the concentration of chloride ions may be no greater than about 10 ppm. The plating solution may also be substantially free from chloride ions.

The combination of the process conditions and geometries of TSV structures may result in no net deposition, or substantially no net deposition, of copper onto field regions between TSVs. Some TSV holes may be closely positioned being separated by a distance of not more than about 25 micrometers.

The current density during plating process may be between about 3 and 30 mA/cm$^2$ over the plating surface. In a specific embodiment, the current density during plating process may be between about 5 and 20 mA/cm$^2$.

In one embodiment, a semiconductor processing apparatus for depositing copper is disclosed. The apparatus includes one or more electroplating baths and a controller for executing a set of instructions. The apparatus may also include a source or supply of plating solution. In certain embodiments, the plating solution has a pH between about 2 and 6 and copper ions in a concentration of at least about 50 grams per liter. The instructions may include contacting a structure having a TSV hole with the plating solution, and while contacting the structure, plating copper into the through silicon via hole to completely fill the through silicon via in a substantially void free manner and over a period of less than about 20 minutes. The apparatus may also include a heater and associated controller interface for maintaining a temperature of the plating solution between about 40° C. and 75° C. for at least a fraction of the time while plating copper into the TSV hole.

These and other features and advantages of the present invention will be described in more detail with reference to the figures and associated description that follows.

DETAILED DESCRIPTION OF A PREFERRED EMBODIMENT

In the following description, numerous specific details are set forth in order to provide a thorough understanding of the present invention. The present invention may be practiced without some or all of these specific details. In some instances, well known process operations have not been described in detail to not unnecessarily obscure the present invention. While the invention will be described in conjunction with the specific embodiments, it will be understood that it is not intended to limit the invention to the embodiments.

In this disclosure various terms are used to describe a semiconductor processing work piece. For example, "wafer" and "substrate" are used interchangeably. The process of depositing, or plating, metal onto a conductive surface via an electrochemical reaction is referred to generally as electroplating or electrofilling.

Through Silicon Vias

A through-silicon via (TSV) is a vertical electrical connection passing completely through a silicon wafer or a die. TSV technology may be used in 3D packages and 3D integrated circuits, sometimes collectively referred to as 3D stacking. For example, a 3D package may contain two or more integrated circuits (ICs) stacked vertically so that they occupy less space. Traditionally, stacked ICs are wired together along their edges, but such wiring increases the stack's dimensions and usually requires extra layers between the ICs. TSVs provide connections through the body of the ICs leading to smaller stacks. Similarly, a 3D single IC may be built by stacking several silicon wafers and interconnecting them vertically. Such stacks behave as a single device and can have shorter critical electrical paths leading to faster operation.

Electronic circuits using TSVs may be bonded in several ways. One method is "wafer-to-wafer", where two or more semiconductor wafers having circuitry are aligned, bonded, and diced into 3D ICs. Each wafer may be thinned before or after bonding. The thinning process includes removal of the wafer material to expose the bottom part of the TSV. TSVs may be formed into the wafers either before bonding or else created in the stack after bonding and may pass through the silicon substrates between active layers and an external bond pad. Another method is "die-to-wafer" where only one wafer is diced and then the singled dies are aligned and bonded onto die sites of the second wafer. The third method is "die-to-die" where multiple dies are aligned and bonded. Similar to the first method, thinning and connections may be built at any stage in the last two methods.

Figure 1:
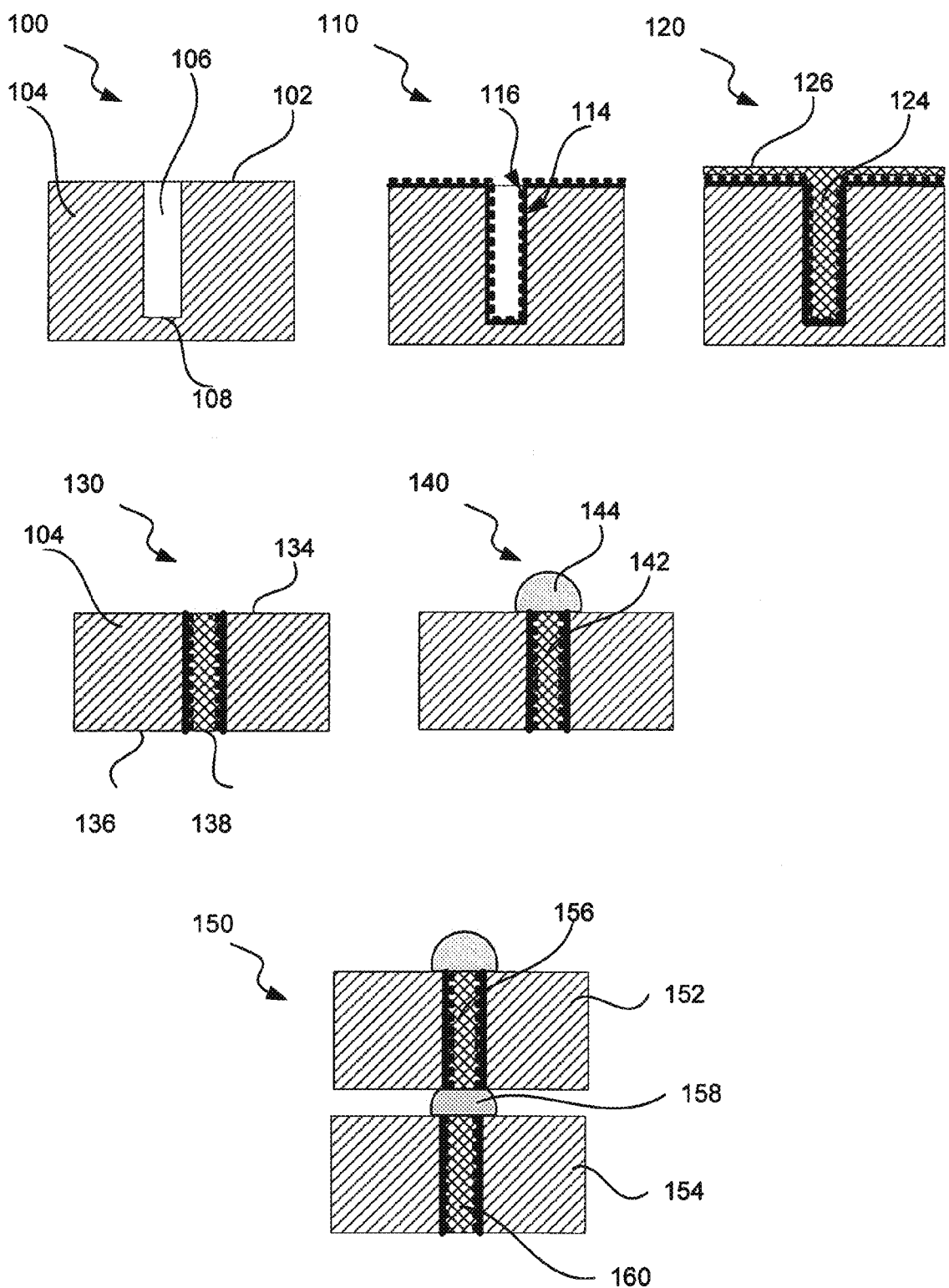
FIG. 1 is a schematic representation of a through silicon via (TSV) at various processing stages starting with TSV hole formation, followed by lining up with a diffusion barrier layer, then electroplating, thinning, forming a solder bump, and interconnecting with another TSV.

FIG. 1 is a schematic representation of a TSV at various processing stages. A TSV may be used with both dies and wafers, generally referred here as semiconductor substrate 104. Examples of the material suitable for a semiconductor substrate 104 include, but are not limited to silicon, silicon on insulator, silicon on sapphire, and gallium arsenide.

In a first cross-section 100, a TSV hole 106 is formed in the semiconductor substrate 104. The depth of the TSV hole 106 must be sufficient to expose the bottom 108 after the subsequent thinning operation. Typically, TSV holes may be between about 5 to 400 microns deep, however the present invention may be practiced with the TSV holes of other sizes as well. The diameter of TSV holes may vary between about 1 to 100 microns. The TSV holes typically have a very high aspect ratio, which is defined as the ratio of the TSV hole depth to the TSV hole diameter (usually at the opening). In certain embodiments, the TSV hole aspect ratio may vary between about 3:1 to 10:1. TSV size also depends on which stage of the overall 3D stacking process includes TSV formation. A TSV can be formed before ("via first") or after ("via last") stacking In the "via-first" configuration, the TSV may be formed before or after creating CMOS structures. In the "via-last" configuration, the TSV may be formed before or after bonding. Moreover, in both configurations, thinning may be performed before or after bonding. The invention may be practiced with any TSV sizes or forming configurations described herein. Table 1 summarizes typical TSV dimensions (in micrometers) for various TSV configurations. While FIG. 1 and the corresponding description generally pertains to the configuration where a TSV is formed before stacking and CMOS processing and thinning are performed before bonding ("via-first"+before CMOS+thinning before bonding), this invention can be readily applied to other configurations. Many aspects of this invention are particularly useful for large size high-aspect ratio vias, such as those formed after stacking but before bonding and where thinning is performed before bonding ("via-last"+before bonding+thinning before bonding).

TABLE 1

| | | "Via - First" | | "Via - Last" | |
| --- | --- | --- | --- | --- | --- |
| | | Before CMOS | After CMOS | Before Bonding | After Bonding |
| Diameter | Thinning Before | 2-5 | 5-20 | 20-50 | 5-50 |
| Depth | Bonding | 30-50 | 40-150 | 50-400 | 30-150 |
| Diameter | Thinning After | 1-5 | 1-5 | 3-5 | 3-5 |
| Depth | Bonding | 5-25 | 5-25 | 5-25 | 5-25 |

Figure 2:
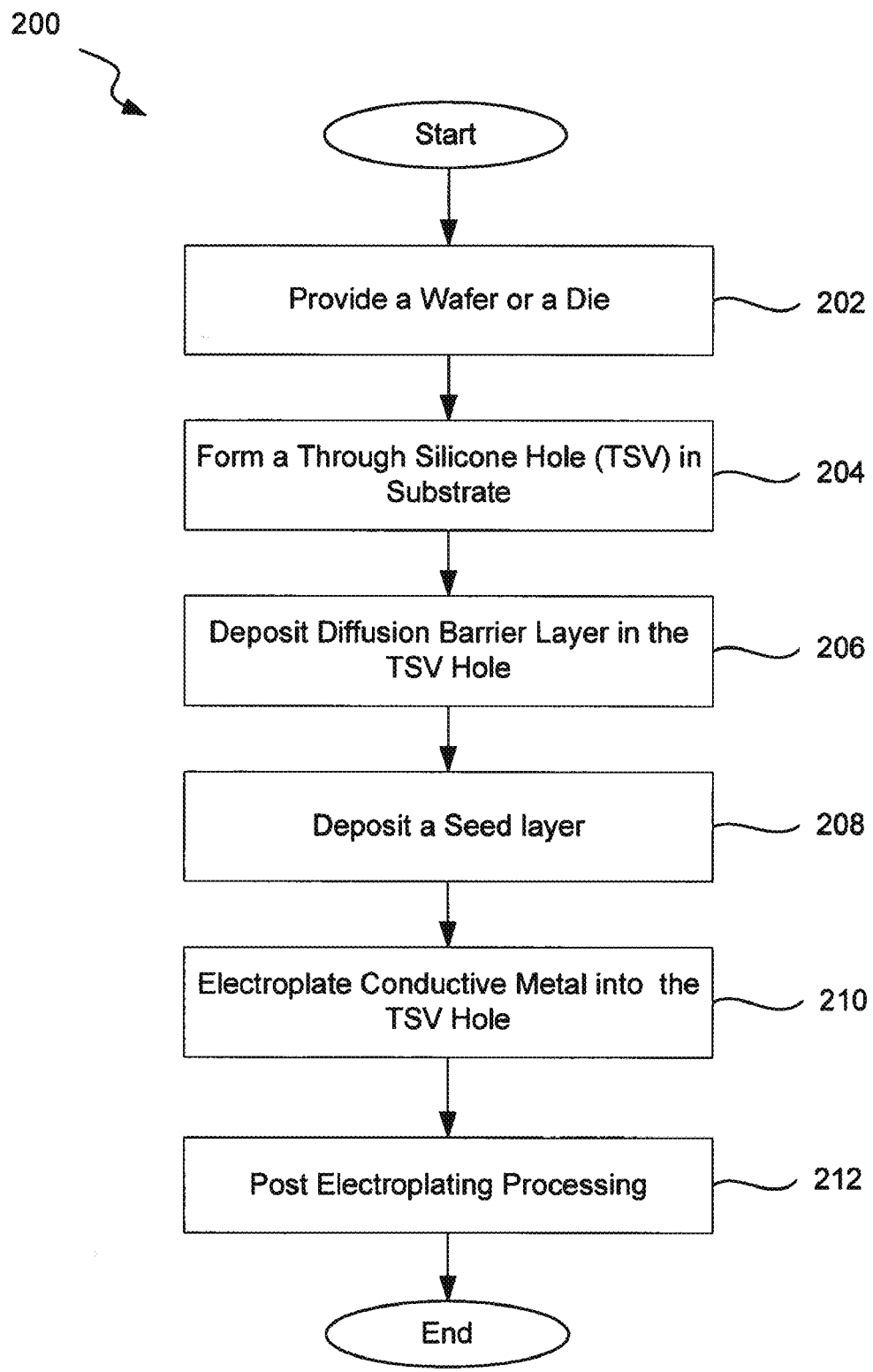
FIG. 2 is a process flow diagram illustrating several operations of TSV processing in accordance with the present invention.

TSV holes may be formed using various methods further discussed in the context of FIG. 2. For example, TSV holes may be etched using a method optimized for high aspect ratio holes. TSV holes may have a slight positive slope and/or a taper near their openings. Such TSV profiles may improve diffusion of metal ions within TSV holes and reduce electroplating time. Returning to FIG. 1, the TSV hole 106 may be formed through a top surface 102, which is often referred to as a wafer field. The top surface 102 may be an active surface of a wafer or a die and include electronic devices. Alternatively, the TSV hole may be formed through the back surface of a wafer or a die where the circuitry is not present.

The cross-section 110 shows deposition of a diffusion barrier layer 114 and a seed layer 116 on the sides and the bottom of the TSV hole 106. Suitable materials for the diffusion barrier layer 114 include tantalum, tantalum nitride, tungsten, titanium, and titanium tungsten. In a typical embodiment, the diffusion barrier layer 114 is formed by a PVD process, such as sputtering, although other techniques such as chemical vapor deposition (CVD) or atomic layer deposition (ALD) may be employed. The seed layer 116 is then deposited to provide a uniform conductive surface for current passage during an electroplating operation. As with the barrier layer deposition, a PVD method may be employed for this operation, although other processes such as electroless deposition may be employed as well. Homogeneity of the seed layer 116 may be important to ensure same conductivity and uniform deposition rate. A typical PVD process may result in the seed layer 116 being significantly thicker around the TSV opening, resulting in lower resistance at the opening and consequently high local deposition rates, which may be particularly undesirable. Copper may be a suitable material for the seed layer.

The next cross-sectional view 120 depicts conductive material 124 as deposited into the TSV hole 106. In embodiments described herein, the conductive material 124 may be electroplated copper. In a typical electroplating process, the substrate 104 is submerged into the plating solution containing metal ions. Current is then generated through the seed layer 116 causing metal ions to flow towards and deposit on the seed layer. Additional details of electroplating are discussed in the context of FIG. 2. Some of the electroplated metal may deposit on the top surface 110 forming an overburden 126. The overburden 126 is not desirable and may have to be removed in post electroplating processes, such chemical mechanical polishing, electroplanarization process, or thinning.

The next cross-section 130 illustrates the substrate 104 after post-electroplating processes to remove overburden. For example, the substrate 104 may go through edge bevel removal, electro-planarization, chemical-mechanical polishing (CMP), thinning and others. As shown, the overburden 126 is removed. The substrate 104 may be thinned forming a new bottom surface 136 and exposing the TSV end 138. A top of the substrate 104 may also be thinned forming a new top surface 134.

The next cross-section 140 shows a solder bump 144 attached to one end of the TSV 142. Examples of materials suitable for forming solder bumps include, but are not limited to, lead based solder materials (such as lead, lead/tin alloys, and others), non-lead based solder materials (such as tin/silver, tin/copper/silver, and copper alloys) and the like. Finally, illustration 150 shows a simple electronic stack where the first die 152 is interconnected with the second die 154 through a solder joint 158. The first die 152 may have the first TSV 156. Similarly, the second die 154 may have the second TSV 160. The first TSV 156, the second TSV 160, or both TSVs may have solder bumps that were used to interconnect the two TSVs and to form the solder joint 158. The stack may include additional dies and additional TSVs. For example, the second TSV may be further interconnected to another TSV in a third stack and so on. Similarly, the first die may have a plurality of TSVs some of which may be connected to TSVs of the second die, while others may be connected to TSVs of other dies. When two adjacent dies have a plurality of interconnections, the corresponding TSVs may need to be aligned. A stack including several dies may also be coupled to a heat spreader to assist in dissipation of the heat generated by the stack.

Electroplating Process and Formation of Through Silicon Vias

FIG. 2 is a process flow diagram 200 of one embodiment in accordance with the present invention. A wafer or a die is provided in operation 202. A TSV hole is then formed in a wafer or a die (block 204). The TSV holes may be formed together with circuit line paths (trenches and Damascene vias) or in a separate operation. In one embodiment, TSV holes are etched, e.g., plasma etched or reactive ion etched. The mask may be a photoresist, for example, in a "via-first" configuration, or an ashable hard mask. Precise profile control (taper, tilt and sidewall roughness) is essential to ensure the quality of subsequent layer deposition and fill processes. In most cases, the TSVs are etched blind into the substrate, and then revealed by thinning in a post electroplating operation 212.

Plasma etching is an ion-enhanced chemical process, which uses RF powered plasma sources for the creation of ions and chemically reactive species. Many etching compositions employed to etch silicon include fluorine chemistry. One example employs sulfur hexafluoride ($SF_6$) together with sidewall passivation based on oxygen ($O_2$) and/or hydrogen bromide (HBr). In another example, sulfur hexafluoride ($SF_6$) plasma is used together with a polymerizing gas such as octafluorocyclobutane ($C_4F_8$). In yet another embodiment, TSV holes may be formed (block 204) by laser drilling or laser ablation. For example, a 355 nm wavelength UV YAG laser may be used to form vias as little as 25 micrometers in diameter. In a typical example, one hundred pulses may form an approximately 750 micrometers deep TSV.

To prevent conductive metal later deposited into the TSV hole from migrating into the surrounding dielectric layer a diffusion barrier layer may be deposited as indicated at block 206. The deposition therefore occurs before electroplating conductive metal (210). As indicated above, a diffusion barrier layer may be deposited by, for example, a physical vapor deposition process. The thickness and properties of the barrier layer depend upon the type of material employed for the barrier layer. In a typical example employing tantalum nitride, the barrier is deposited to a thickness of between about 5 and 50 nanometers on the TSV sidewalls. After depositing the barrier layer, the next operation is depositing a seed layer 208 to provide uniform current deposition during the electroplating; see block 210. As indicated above, the seed layer is typically PVD-formed copper, although other seed layers such as ruthenium may be employed in some embodiments. The seed layer generally should be continuous on all surfaces in the TSV structure in order to avoid localized corrosion dissolution and low local plating rates and to achieve maximum adhesion of the plated copper to the dielectric. A smooth etched surface of the TSV may facilitate deposition of continuous seed layer coverage since rough and irregular etch profiles can locally shadow some TSV surfaces during PVD deposition. In some embodiments, in order to avoid oxidation by air, the copper seed layer may be at least about 2 nm thick, but thickness as high as 200 nm is also acceptable because of large size of TSV structure. Pre-treatment of the copper seed layer may be desirable in some processes to achieve uniform wetting. Because pre-treatments often etch small amounts of copper seed, it is often desirable that a minimum seed layer thickness be 4-5 nm when a pre-treatment step is used. Pre-treatment can be performed using water, dilute acidic or basic solutions, solutions containing strong surfactants, plating solutions, or combinations of thereof. The seed layer may be susceptible to dissolution in the electrolyte by the electrolyte's own exchange current. Thus, a small voltage may be applied to the dielectric before it is introduced into the electrolyte. Alternatively, the plating current is applied instantaneously as the substrate comes in contact with the electrolyte.

The wafer is then electroplated with conductive metal that fills the entire volume of the TSV holes (block 210). Voids and seams are highly undesirable. In typical embodiments, copper is used in the electroplating operation. Electroplating into TSV holes may present some challenges. In conventional plating processes, the deposition rate may be faster near the opening, where the seed layer has greatest thickness (lowest resistance) and more metal ions are present. Moreover, deposition may take several hours to supply enough metal ions to fill an entire TSV hole.

A typical technology for plating TSVs uses plating solution with approximately 10 gram per liter concentration of sulfuric acid. Such high acid concentration increases the conductivity of the plating solution, thereby providing for more uniform current distribution. However, a high concentration of highly mobile hydrogen ions impedes the transfer of much larger copper ions by migration. One way to express relative contribution of ions to the total deposition current flow is using transference number. The transferred number for copper ions in a typical electroplating process described above is less than 0.1. Therefore, less than 10% of the overall current flow through the solution in a TSV is carried by migration of cupric ions, while the remainder of the current is carried by other ions, such as hydrogen ions. Such low transference number is attributed to the combined effect of high mobility and concentration of hydrogen ions and much lower mobility, and often relatively low concentration of copper ions.

In one embodiment a plating solution substantially free from acid may be used. For example, plating solutions with pH values in the range of 2-6 may be used. In a specific embodiment, a plating solution with pH values in the range of 3-5 is used. In such compositions, more copper ions are transported to the surface than in lower pH acidic solutions.

To further facilitate copper deposition, the plating solution may also include high concentrations of copper ions. For example, the concentration of copper ions may be between about 0.8M to 3.0M. Such plating solutions at low pH, as specified above, may result in the copper ions transference number increasing to a level of not less than about 0.2. In one specific embodiment, the copper ions transference number may be at least about 0.4. The source of copper ions may be copper sulfate ($CuSO_4$), copper methane sulfonate ($Cu(CH_3SO_3)_2$), copper gluconate ($C_{12}H_{22}CuO_{14}$), copper sulfamate, copper nitrate, copper phosphate, copper chloride and others. While generally higher concentrations of copper ions are desired, they are usually limited by solubility of the copper containing salt used. For example, copper sulfate may be only dissolved up to approximately 80 grams/liter (1.25 Molar) (based on copper ion weight) in a typical plating solution formulation at room temperature.

One way to improve solubility and metal ion mobility within the plating solution is by increasing plating solution's temperature. For example, the solubility of copper sulfate in water approximately doubles when the temperature of the solution is raised from about room temperature to about 70° C. In one embodiment, the temperature of the plating solution may be maintained at between about 40-75° C. In a specific embodiment, the temperature is maintained between about 50-70° C. Higher temperatures are desirable, but an electroplating apparatus may present some constraints. For example, all lines carrying the plating solution my have to be kept at elevated temperature to avoid salt precipitation during operation. In one embodiment, the electroplating apparatus may be filled with low copper ion content plating solution, which is then warmed up before adding copper salts. In the same or another embodiment, the plating solution may be diluted after the plating operation is completed but before draining the solution.

To assist in plating process one or more levelers, brighteners or accelerators, inhibitors, suppressors, enhancers, and/or surfactants may be used. Accelerators may include a polar sulfur, oxygen, or nitrogen functional group that help to increase deposition rates and may promote dense nucleation leading to films with a fine grain structure. Accelerators may be present at a low concentration level, for example 0-200 ppm. While the accelerator may produces high deposition rates within the TSV hole, the accelerator may be transported away from the substrate top surface (field region) and/or consumed by reaction with oxygen in the bulk solution. Suppressors are additives that reduce the plating rate and are usually present in the plating bath at higher concentrations, for example 5-1,000 ppm. They are generally polymeric surfactants with high molecular weight, such as polyethylene glycol (PEG). The suppressor molecules slow down the deposition rate by adsorbing on the surface and forming a barrier layer to the copper ions. Because of their large size and low diffusion rate, suppressors are less likely to reach the lower part of the TSV than the wafer field resulting in lower concentrations at the bottom of the TSV. Therefore, most of suppressing effect occurs on the surface of the substrate (field region), helping to reduce overburden and avoid TSV hole "closing". Levelers are the additives whose purpose is to reduce surface roughness. They are present, if at all, in very small concentrations, such as 1-100 ppm, and their blocking effects at the surface are highly localized. As a result, levelers selectively reduce deposition mainly on the high spots allowing the low spots to level out. This behavior can also be used to enhance the plating rate of copper at the base of the TSV relative to the growth rate on the wafer field. In some cases, levelers may contain functional groups which include nitrogen atoms which exhibit a tendency to form complexes with Cu(I) ions at the wafer interface. Finally, chloride ions may be present in the plating bath at a concentration of no greater than about 300 ppm. In a specific embodiment, the chloride concentration is no greater than about 50 ppm or even no greater than about 2 ppm.

The plating solution may also include an oxidizing agent, such as dissolved oxygen gas, hydrogen peroxide and other organic and inorganic peroxides, Fe(III) ion, Ce(IV) ion, ozone, chlorine, iodine, bromine, sulfides, disulfides or oxidizing additives (particularly accelerators, such as bis(sodium sulfopropyl)disulfide (SPS)) and other oxidizing compounds. To control the oxidizing behavior of the solution, reducing agents, such as glyoxylic acid, formaldehyde, ammonium hypophosphite, and dimethylamineborane, may be used. It is believed that such oxidizing agents can effectively limit overburden during copper deposition in TSVs by selectively etching copper or stabilizing Cu(I) at the wafer field during electroplating. The oxidizing agent employed (such as those listed above) may be added in amounts appropriate to ensure this selective deposition. While not applicable in all situations to all oxidizing agents, it has been found that plating baths having oxidizing agents in the range of about 1 ppm to 200 ppm (more specifically about 1 ppm to 100 ppm) perform well. In one embodiment, the plating solution includes hydrogen peroxide (30% by weight) at concentrations between about 0.0025 ml/L to 50 ml/L (or about 0.1 ml/L to 30 ml/L). In a specific embodiment, the concentration of hydrogen peroxide solution may vary between about 2.5 ml/L to 25 ml/L (30% hydrogen peroxide by weight). For example, adding 2.5 ml/L of 30% hydrogen peroxide to a plating solution including 40 g/L of copper ions and no acid or chloride additives allowed plating of a 5 µm wide and 25 µm deep TSV structure within 10 min at 10 mA/cm² that was substantially free from voids and overburden. Similar results were achieved for hydrogen peroxide concentrations of 5 ml/L, 12.5 ml/L, and 25 ml/L (added 30% by weight solution). Without being restricted to any particular theory, it is believed that oxygen or other oxidizing agents in the plating solution stimulates formation of localized corrosion cells around TSV openings even when deposition currents are applied. It is possible that the localized mass transfer around the TSV openings and within the TSV structures results in very different localized potential in two different areas.

This observed effect may be characterized in various ways. Most generally it is evidenced by little or no overburden formed while TSVs are filled. In other words, the copper deposition is strongly selective for TSVs, with little if any copper depositing on field regions during some or all of the TSV filling process. In many embodiments, the amount of overburden, if any, deposited is less than about 100 nanometers when the TSVs are completely filled. Generally, these effects are contingent on the presence of an oxidizing agent or other species which enhances the stability of the partially oxidized Cu(I) ion in the plating bath. Therefore suitable plating baths (i.e., plating baths facilitating this phenomenon) may also be characterized by their ability to etch copper from a substrate in the absence of a plating current. In a specific example, the plating solution is characterized by an ability to etch copper from a wafer field at a rate of between about 200 and 3000 Å/minute (more specifically 500 to 2500 Å/minute and even more specifically 1000 to 2000 Å/minute) when current is not applied to the wafer. An effect may alternatively (or in addition) be characterized by a stable copper (I) ion generated at the substrate surface. One manifestation of this stable species is in the cyclic voltammograms of solutions promoting this effect. For example, a rotating copper ring disk electrode exhibiting a stronger Cu(I) peak (in comparison to a similar solution lacking an oxidizing environment conducive to the effect) may indicate that the solution will selectively deposit copper in the TSVs with little or no overburden forming.

In some embodiments, the selective deposition effect is promoted by carefully controlling the oxidizing environment proximate the substrate surface. Thus, in some cases, it may be appropriate to remove one or more oxidizing agents from solution in order to permit the actions (mechanisms) of one or more others to proceed unperturbed. It has been observed, for example, that some plating solutions operating with a reduced oxygen concentration compared to ambient condition—as achieved by for example sparging the plating solution with nitrogen—strongly exhibit the selective deposition effect. Such solutions make use of another oxidation agent such as SPS. It is believed that the beneficial effect observed may be due to an oxidizing gradient in the plating bath in which the oxidizing agent is present in greater local concentrations close to the field and lower local concentrations in the TSVs.

Table 2 shows the oxidation rates of copper in various solution compositions and using various conditions. The plating solution had 60 g/L of copper and had a pH of 4. The oxidation rates were measured with no current applied to the wafer. Selective deposition in a TSV structure can benefit from etching on the surface of the wafer while copper is deposited within the structure, which may be achieved using a solution with a high chemical etch rate. In general, rapid selective filling of TSVs can be achieved using solutions with high chemical etch rates, while deposition in solutions with low etch rates is generally more uniform between the wafer field and the TSV base. For example, a solution with 100 ppm Cl⁻ shows little oxidation of copper and results in conformal plating. The assumption here is that the same voltage is applied to an adjacent field and a TSV. However, the polarization curve for the field surface at the given potential results in dissolution, while the polarization curve for the surface within the TSV allows for deposition at the same potential. To generate such condition, it is necessary to have a gradient of oxidizing agent or other chemical species which impact oxidation behavior between the wafer field and the TSV base.

TABLE 2

| Test No. | Temp [C.] | Cl [ppm] | Accelerator [ppm] | Suppressor [ppm] | Leveler [ppm] | Time [sec] | Oxidation Rate [A/min] |
|---|---|---|---|---|---|---|---|
| 1 | 25 | 0 | 0 | 0 | 0 | 30 | 341 |
| 2 | 35 | | | | | 30 | 158 |
| 3 | 45 | | | | | — | — |
| 4 | 55 | | | | | 30 | 875 |
| 5 | 65 | | | | | 10 | 2079 |
| 6 | 75 | | | | | 10 | 2444 |
| 7 | 25 | 50 | | | | 30 | 144 |
| 8 | 45 | | | | | — | — |
| 9 | 65 | | | | | 15 | 656 |
| 10 | | 0 | | | | 10 | 2079 |
| 11 | | | | | 12 | | 2045 |
| 12 | | | | 4 | 0 | | 1959 |
| 13 | | | | 4 | 12 | | 2311 |
| 14 | | | 7 | 0 | 0 | | 1138 |
| 15 | | | | 0 | 12 | | 1232 |
| 16 | | | | 4 | 0 | 15 | 936 |
| 17 | | | | 4 | 12 | 15 | 637 |
| 18 | | 10 | 0 | 0 | 0 | 30 | 359 |
| 19 | | | | 0 | 12 | | 189 |
| 20 | | | | 4 | 0 | | 216 |
| 21 | | | | 4 | 12 | | 173 |
| 22 | | | 7 | 0 | 0 | | 280 |
| 23 | | | | 0 | 12 | | 182 |
| 24 | | | | 4 | 0 | | 446 |
| 25 | | | | 4 | 12 | | 183 |

The substrate may be rotated and vibrated to provide agitation around boundary layer. For example, at a rotational speed of between about 20 rpm and about 50 rpm may be used. Additionally, the dissolution cycle may be performed at high current density for very short intervals leading to removal of peaks and widening of TSV openings. Furthermore, the deposition interval may be mixed with equilibration interval that allows for copper ion concentration within the TSV to equilibrate.

Returning to FIG. 2, after electro-filling conductive material into the TSV holes, the wafer may go through one or more post electrofill processing operations (block 212). If overburden is present, it will need to be removed in one of these operations. For example, chemical mechanical polishing (CMP) may be used. Other operations may include electroplanarization and/or chemical etching. Moreover, a wafer, a die, or a stack containing a TSV may be thinned to expose the bottom of the TSV to be used for other interconnections. Thinning may be carried out by any processes, for example grinding, etching, or CMP.

The Electroplating Apparatus

A general electroplating hardware is now discussed to provide context for the present invention. The apparatus includes one or more electroplating cells in which the wafers are processed. To optimize the rates and uniformity of electroplating, additives are added to the electrolyte; however, an electrolyte with additives may react with the anode in undesirable ways. Therefore anodic and cathodic regions of the plating cell are sometimes separated by a membrane so plating solutions of different composition may be used in each region. Plating solution in the cathodic region is called catholyte; and in the anodic region, anolyte. A number of engineering designs can be used in order to introduce anolyte and catholyte into the plating apparatus.

Figure 3:
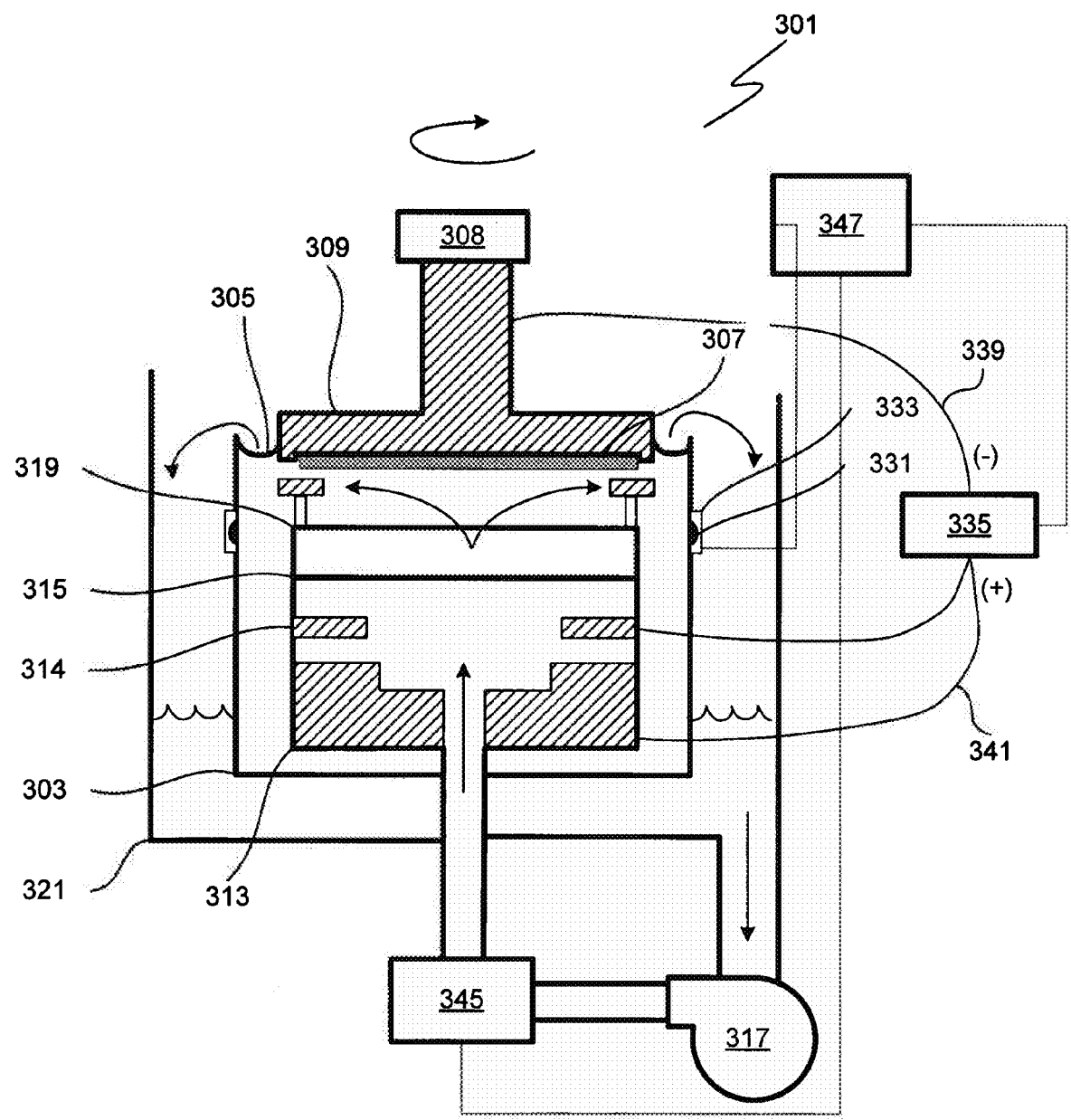
FIG. 3 is a schematic representation of an electroplating apparatus in accordance with an embodiment of the present invention.

Referring to FIG. 3, a diagrammatical cross-sectional view of an electroplating apparatus 301 in accordance with one embodiment is shown. The plating bath 303 contains the plating solution (having a composition as described above), which is shown at a level 305. The catholyte portion of this vessel is adapted for receiving wafers in a catholyte. A wafer 307 is immersed into the plating solution and is held by, e.g., a "clamshell" holding fixture 309, mounted on a rotatable spindle 311, which allows rotation of clamshell 309 together with the wafer 307. A general description of a clamshell-type plating apparatus having aspects suitable for use with this invention is described in detail in U.S. Pat. No. 6,156,167 issued to Patton et al., and U.S. Pat. No. 6,800,187 issued to Reid et al, which are incorporated herein by reference for all purposes.

An anode 313 is disposed below the wafer within the plating bath 303 and is separated from the wafer region by a membrane 315, preferably an ion selective membrane. For example, Nafion™ cationic exchange membrane (CEM) may be used. The region below the anodic membrane is often referred to as an "anode chamber." The ion-selective anode membrane 315 allows ionic communication between the anodic and cathodic regions of the plating cell, while preventing the particles generated at the anode from entering the proximity of the wafer and contaminating it. The anode membrane is also useful in redistributing current flow during the plating process and thereby improving the plating uniformity. Detailed descriptions of suitable anodic membranes are provided in U.S. Pat. Nos. 6,126,798 and 6,569,299 issued to Reid et al., both incorporated herein by reference for all purposes. Ion exchange membranes, such as cationic exchange membranes are especially suitable for these applications. These membranes are typically made of ionomeric materials, such as perfluorinated co-polymers containing sulfonic groups (e.g. Nafion™), sulfonated polyimides, and other materials known to those of skill in the art to be suitable for cation exchange. Selected examples of suitable Nafion™ membranes include N324 and N424 membranes available from Dupont de Nemours Co.

During the plating the ions from the plating solution are deposited on the substrate. The metal ions must diffuse through the diffusion boundary layer and into the TSV hole. A typical way to assist the diffusion is through convection flow of the electroplating solution provided by the pump 317. Additionally, a vibration agitation or sonic agitation member may be used as well as wafer rotation. For example, a vibration transducer 308 may be attached to the wafer chuck 309.

The plating solution is continuously provided to plating bath 303 by the pump 317. Generally, the plating solution flows upwards through an anode membrane 315 and a diffuser plate 319 to the center of wafer 307 and then radially outward and across wafer 307. The plating solution also may be provided into anodic region of the bath from the side of the plating bath 303. The plating solution then overflows plating bath 303 to an overflow reservoir 321. The plating solution is then filtered (not shown) and returned to pump 317 completing the recirculation of the plating solution. In certain configurations of the plating cell, a distinct electrolyte is circulated through the portion of the plating cell in which the anode is contained and mixing with the main plating solution is prevented using sparingly permeable membranes or ion selective membranes.

A reference electrode 331 is located on the outside of the plating bath 303 in a separate chamber 333, which chamber is replenished by overflow from the main plating bath 303. A reference electrode 331 is typically employed when electroplating at a controlled potential is desired. The reference electrode 331 may be one of a variety of commonly used types such as mercury/mercury sulfate, silver chloride, saturated calomel, or copper metal. In the context of this invention, voltages applied to the wafer are expressed relative to the copper metal reference electrode.

A DC power supply 335 can be used to control current flow to the wafer 307. The power supply 335 has a negative output lead 339 electrically connected to wafer 307 through one or more slip rings, brushes and contacts (not shown). The positive output lead 341 of power supply 335 is electrically connected to an anode 313 located in plating bath 303. The power supply 335 and a reference electrode 331 can be connected to a system controller 347 among other functions, which allows modulation of current and potential provided to the elements of electroplating cell. For example, the controller may allow electroplating either in galvanostatic (controlled current) or potentiostatic (controlled potential) regime. The controller may include program instructions specifying current and voltage levels that need to be applied to various elements of the plating cell, as well as times at which these levels need to be changed. For example, it may include program instructions for transitioning from forward current (depositing copper) to reverse current (removing copper) or from potential-control to current-control upon complete immersion of the wafer into the plating bath or at some later time.

During a forward current pulse, the power supply 335 biases the wafer 307 to have a negative potential relative to anode 313. This causes an electrical current to flow from anode 313 to the wafer 307, and an electrochemical reduction (e.g. $Cu^{2+}+2\,e^- = Cu^0$) occurs on the wafer surface (the cathode), which results in the deposition of the electrically conductive layer (e.g. copper) on the surfaces of the wafer. During a reverse current pulse, the opposite is true. The reaction on the wafer surface is an oxidation (e.g. $Cu^0 \rightarrow Cu^{2+}+2\,e^-$), which results in the removal of the copper.

An inert anode 314 may be installed below the wafer 307 within the plating bath 303 and separated from the wafer region by the membrane 315. It may serve a function of an electron sink. For example, Fe(II) ions may be oxidized to Fe(III) ions on the inert anode 314. Both Fe(II) and Fe(III) ions remain dissolved in the plating solution without being deposited on the inert anode 314. Fe (III) ions are then passed through the membrane 315 and are reduced back to Fe (II) on the wafer 307, preferably on the wafer field, while oxidizing copper from elemental copper to Cu(II) ions that are dissolved back into the plating solution. Therefore, localized reduction of the iron ions may help to remove overburden from the wafer field during electroplating of the TSV structure. The concentration balance between Fe(II) and Fe(III) may be maintained using the inert anode 314. In certain embodiments, the concentration balance tends strongly toward Fe(II). For example, the Fe(III) ions may be present in a concentration of between about 0.5 and 1.5 g/liter, while the Fe(II) ions may be present in a concentration of between about 5 and 15 g/liter. In a specific embodiment, the Fe(III) concentration is about 0.5-1 g/liter and the Fe(II) concentration is about 10 to 12 g/liter.

The apparatus may also include a heater 345 for maintaining the temperature of the plating solution at a specific level. The plating solution may be used to transfer the heat to the other elements of the plating bath. For example, when a wafer 307 is loaded into the plating bath the heater 345 and the pump 317 may be turned on to circulate the plating solution through the electroplating apparatus 301, until the temperature throughout the apparatus becomes substantially uniform. In one embodiment the heater is connected to the system controller 347. The system controller 347 may be connected to a thermocouple to receive feedback of the plating solution temperature within the electroplating apparatus and determine the need for additional heating.

Figure 4:
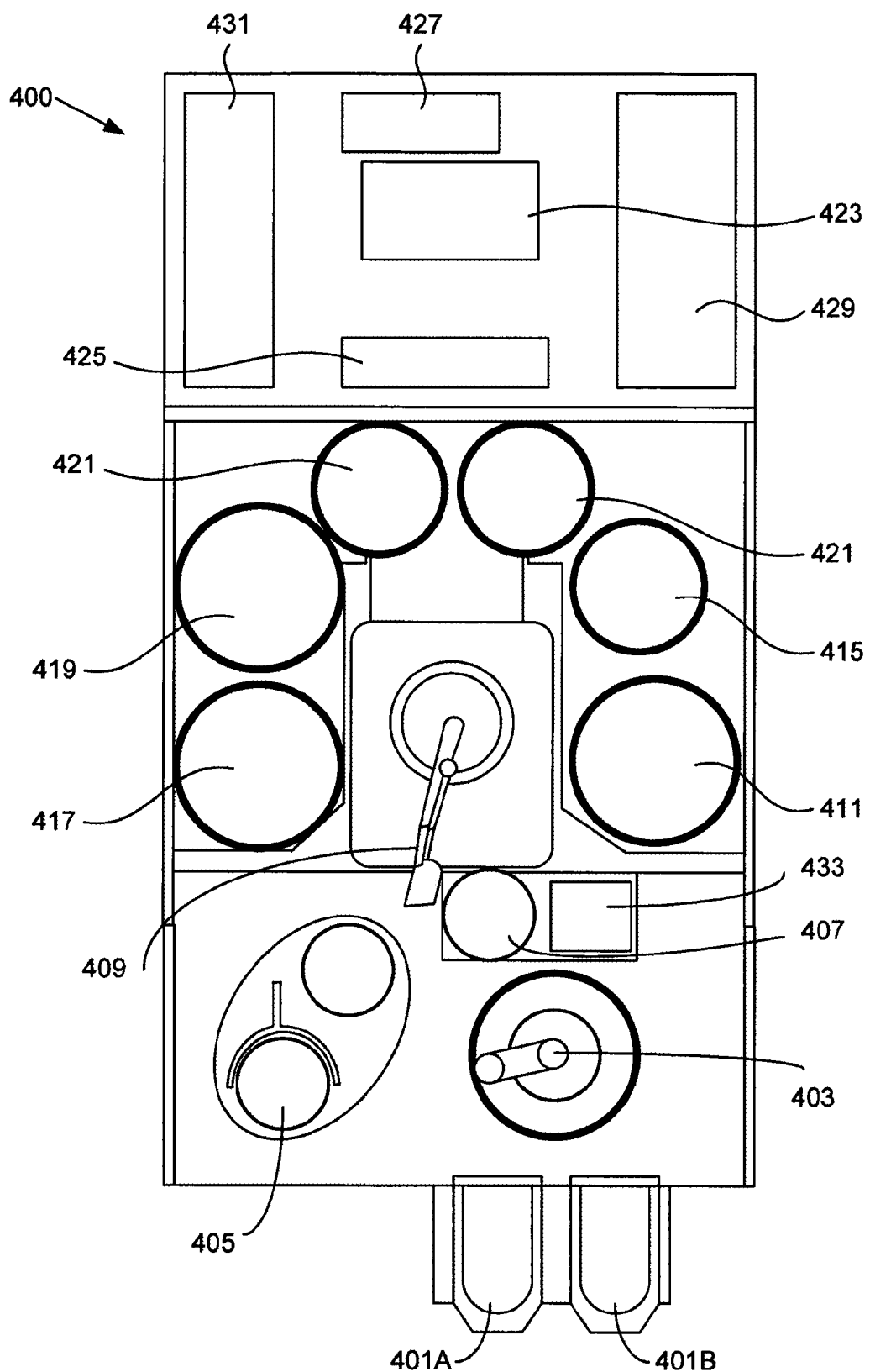
FIG. 4 is a graphical representation of a semiconductor processing apparatus in accordance with one embodiment of the present invention.

The present invention also pertains to system level apparatus capable of executing the process flow and the process conditions described above. FIG. 4 depicts an electroplating system 400 as an embodiment of one aspect of the present invention. The system includes three separate electroplating or electroplating modules 411, 417 and 419. System 400 also includes three separate post electrofill modules (PEMs) 415 and two 421's. Each PEM may be employed to perform each of the following functions: edge bevel removal, backside etching, acid cleaning, spinning, and drying of wafers after they have been electroplated by one of modules 411, 417 and 419. System 400 also includes a chemical dilution module 425 and a primary electroplating bath 423, i.e., the TSV plating bath of composition described above. This is a tank that holds the chemical solution used as the electroplating bath in the electroplating modules. System 400 also includes a dosing system 427 that stores and delivers chemical additives for the plating bath. A chemical dilution module 425 stores and mixes chemicals to be used as the etchant in the post electrofill modules. A filtration and pumping unit 429 filters the plating solution for central bath 423 and pumps it to the electroplating modules. Finally, an electronics unit 431 provides the electronic and interface controls required to operate system 400. Unit 431 may also provide a power supply for the system.

In operation, an atmospheric robot including a robot arm 403 selects wafers from a wafer cassette or FOUPs (front opening unified pods) such as a cassette 401A or a cassette 401B. Robot arm 403 may attach to the wafer using a vacuum attachment or some other attaching mechanism. In certain embodiments, aligner 407 includes alignment pins against which robot arm 403 pushes the wafer. When the wafer is properly aligned against the alignment pins, the robot arm 409 moves to a preset position with respect to the alignment pins. In other embodiments, the aligner 407 determines the wafer center so that the robot arm 409 picks up the wafer from the new position. It then delivers the wafer to an electrofill module such as electrofill module 411 where the copper is electroplated onto the wafer. Electrofill module 411 may employ electrolyte from a secondary bath (not shown).

Robot arm 403 moves the wafer back through the aligner 407 and transfer robot 409 to an electrofill module 417 or 419 for bulk electroplating. After the features are filled with copper, the wafer is moved to the PEMs 421. There, unwanted copper from certain locations on the wafer (namely the edge bevel region and the backside) is etched away by an etchant solution provided by chemical dilution module 425. The PEMs 421 also cleans, rinses, and dries the wafer.

After processing in post electrofill modules 421 is complete, robot arm 409 retrieves the wafer from the module and returns it to cassette 401A or 401B. A post electrofill anneal may be completed in system 400 or in another tool. In one embodiment, the post electrofill anneal is completed in one of the anneal stations 405. In other embodiments, dedicated annealing systems such as a furnace may be used. Then the cassettes can be provided to other systems such as a chemical mechanical polishing system for further processing.

Suitable semiconductor processing tools include the Sabre System manufactured by Novellus Systems of San Jose, Calif. or the Slim cell system manufactured by Applied Materials of Santa Clara, Calif., or the Raider tool manufactured by Semitool of Kalispell, Mont.

Figure 5A:
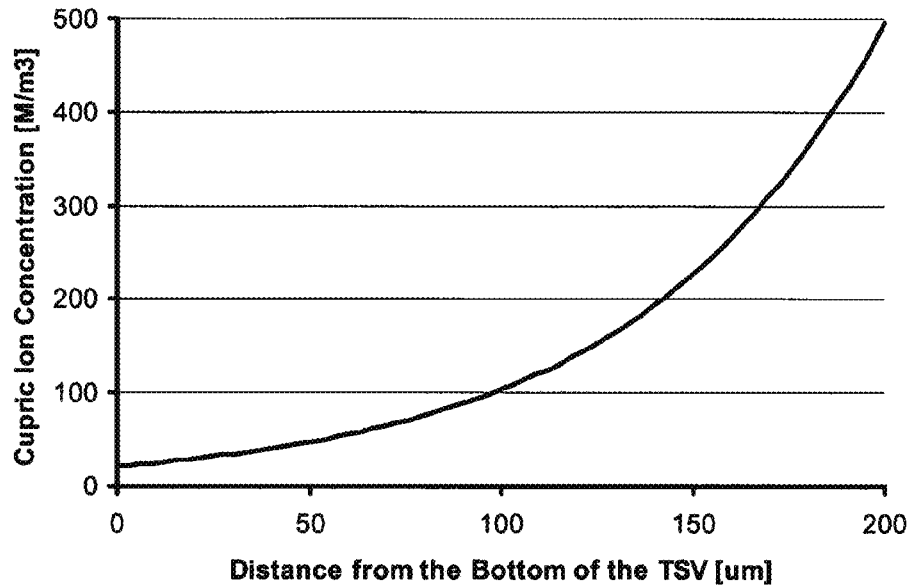
FIG. 5A is a plot of a concentration profile of copper ions inside a 200 micrometers deep TSV as a function of the distance from the bottom of the TSV for a typical electroplating process conditions.

FIG. 5A illustrates a plot of the concentration profile of the copper ions inside the TSV as a function of the distance from the bottom of the TSV. This plot assumes a conventional plating bath, which has a low pH and relatively low copper ion concentration. As shown in the plot, the concentration is the highest around the TSV entry. With sufficient agitation this concentration may be close to the copper ion concentration in the bulk plating solution. The concentration rapidly decreases inside the TSV. Even though TSVs have relatively large sizes, for example in comparison to Damascene vias, the external agitation of the plating solution does not provide sufficient agitation within the TSV structure since the TSV lies within the stagnant diffusion layer of solution on the wafer surface. Therefore, copper ions may be transported within the TSV primarily by diffusion. The diffusion depends on ion mobility. During deposition, the concentration gradient in the TSV is determined by the relative rates of diffusion into the TSV and the deposition of copper. While the deposition generally relates to copper ion concentration, this relationship can be substantially altered by accelerators, suppressants, and levelers which can change the relative deposition rate as a function of position in the TSV.

Because deposition rate at the bottom of the TSV structure must be higher than around the opening of the structure to prevent voids, it is highly desirable to maintain a high concentration of copper ions at the bottom of the structure. Moreover, TSV structures are large and require many ions to be deposited to fill the structure entirely. Therefore, a low concentration may result in very long deposition time and, as can be appreciated, the concentration profile shown in FIG. 5A is not desirable for uniform and fast plating within TSV structures. Small concentration gradients within TSVs (top to bottom) are highly beneficial, but may not be possible with traditional plating chemistries and methods. The improved process described above indicates that increasing the pH of a plating solution helps to improve copper ion mobility and therefore improve diffusion into the TSV hole effectively reducing copper ion gradient. Moreover, increasing temperature of the solution increases copper ion mobility. For example, a change for 25 to 65° C. increases mobility by about 300%.

Figure 5B:
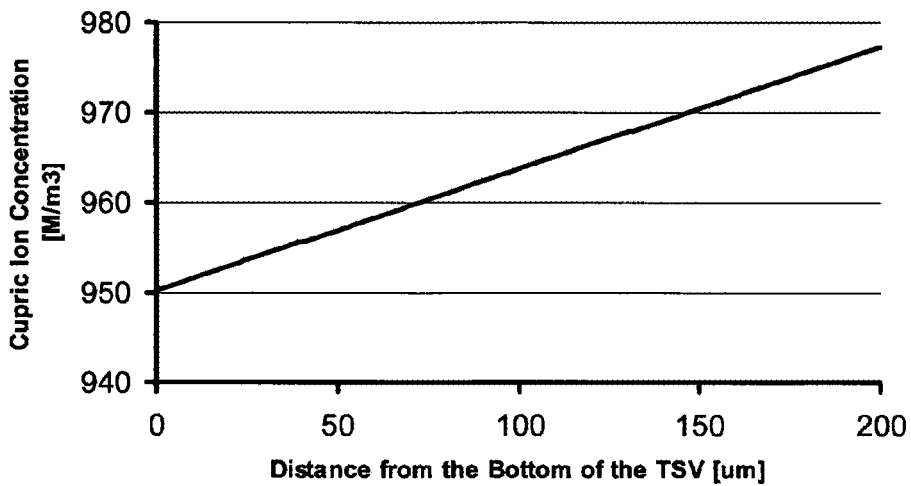
FIG. 5B is a plot of a concentration profile of copper ions inside a 200 micrometers deep TSV as a function of the distance from the bottom of the TSV in accordance with one embodiment of the present invention.

FIG. 5B illustrates a plot of the copper ions concentration during 200 μm deep 30 μm wide TSV plating using the solution at 65° C. with 65 g/L copper and a pH of 4. The solution has much higher overall concentration of copper in the bulk solution, i.e. approximately 1.0M. Moreover, the concentration of copper ions remains relatively constant through the entire TSV. The difference between the TSV opening (distance from the bottom of 200 μm) and the bottom of the TSV is only about 3%. To the contrary a concentration gradient for the same TSV structure using traditional plating solution shown in FIG. 5A is more than 90%. Therefore, two plots indicate substantial improvement in copper concentration uniformity using a plating method with lower pH, higher copper ion concentration, and higher temperature.

Figure 6:
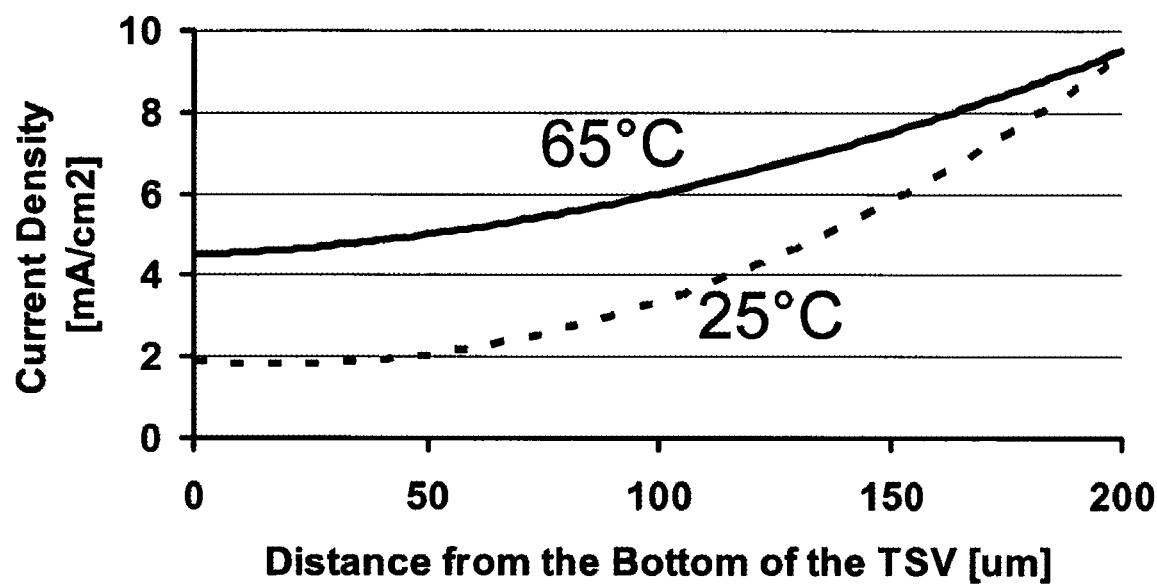
FIG. 6 is a plot of two current density profiles inside a 200 micrometers deep TSV as a function of the distance from the bottom of the TSV at two temperatures of the plating solution in accordance with one embodiment of the present invention.

FIG. 6 illustrates the plot of two current profiles in a 200 micron deep 50 micron wide TSV using an average current density of 10 mA/cm$^2$ based on the surface area of the top wafer, i.e. the field region at two different temperatures. The solid line represents the current density distribution within the TSV for a plating operation performed at around 65° C. for 1.0M copper ion concentration. The dashed line represents the current density distribution for plating performed at around 25° C. for 0.62M copper ion concentration. Much more uniform current distribution and, as a result, more uniform copper deposition happen at higher temperature (the solid line), which may be attributed to the higher copper ion mobility at 65° C. than at 25° C. Probability of voids in plated TSVs is substantially reduced with more uniform current and may allow increased the deposition current and accelerating overall deposition rates, which is particularly important for the large size TSVs. As it can be observed from FIG. 6, while, the current density is about the same at the top of TSV (distance of 200 micrometers from the bottom) for both plating temperatures, which corresponds to the target current density for the process of 10 mA/cm$^2$. Inside the TSV the current density drops towards the bottom of the TSV. There is a strong relationship between the current density illustrated in this plot and the concentration profiles shown in FIG. 5. The current density is representative of the copper deposition rate at a particular depth level inside the TSV. The higher deposition rates need more copper ions, i.e. the concentration must be higher in areas with higher deposition rates. FIG. 6 indicates that in 25° C. solution (the dotted line) the current density drops to less than 2 mA/cm$^2$ at the bottom of the TSV. The plot also indicates that the current density drop for 65° C. plating is only about 4.5 mA/cm$^2$ for the same corresponding locations in the TSV. Therefore, the deposition rate at the bottom of the TSV was much higher for the solution using the warmer solution.

EXAMPLES

Figure 7:
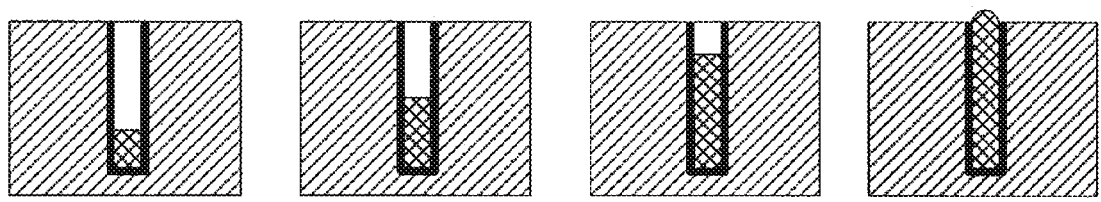
FIG. 7 is an illustrative representation of the copper deposition inside a 25 micron deep TSV holes at four different time periods throughout the electroplating process in accordance with one embodiment of the present invention.
Figure 7:
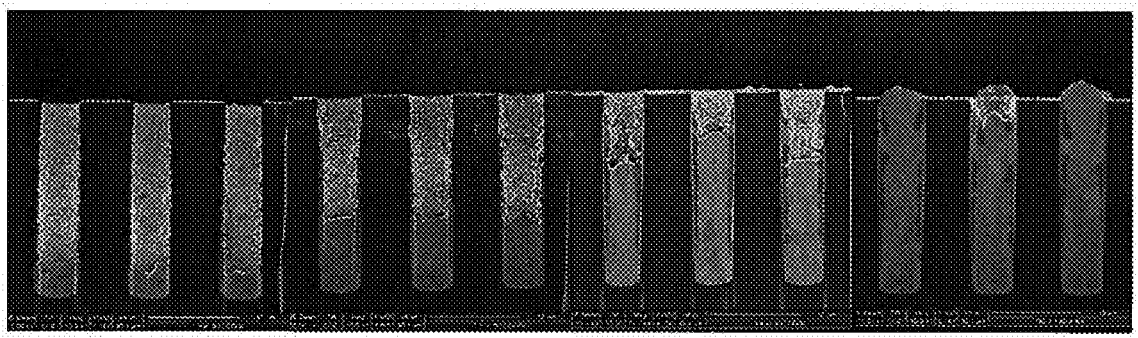

FIG. 7 presents the electroplating results for 25 micron deep 5 micron diameter TSV structures after plating for 1, 2, 3, and 4 minutes. Plating was performed at 60° C. using a solution at pH 3.5 containing 60 g/L concentration of copper ions, 3.5 ml/L Viaform accelerator (ATMI, Danbury, Conn.), 1 ml/L Viaform suppressor (ATMI, Danbury, Conn.), and 6 ml/L Extreme leveler (ATMI, Danbury, Conn.). No chloride ions were present in the solution. The wafer was placed into the bath without any current applied. The plating was performed in a bench-top plating cell using a typical agitation from a standard pump. FIG. 7 indicates that the copper first deposited on bottom of the TSV. Such distribution of copper deposition is highly beneficial and helps to prevent voids. FIG. 7 also indicates that no overburden was deposited in the regions between TSVs. Without being restricted to any particular theory, it is believed that localized corrosion cells may have been formed in between the TSV structures. Lack of overburden simplifies the subsequent processing such as electro-planarization and CMP. Moreover, the localized corrosion allows formation of a bump on a TSV (i.e. extend TSV above the field level).

Figure 8:
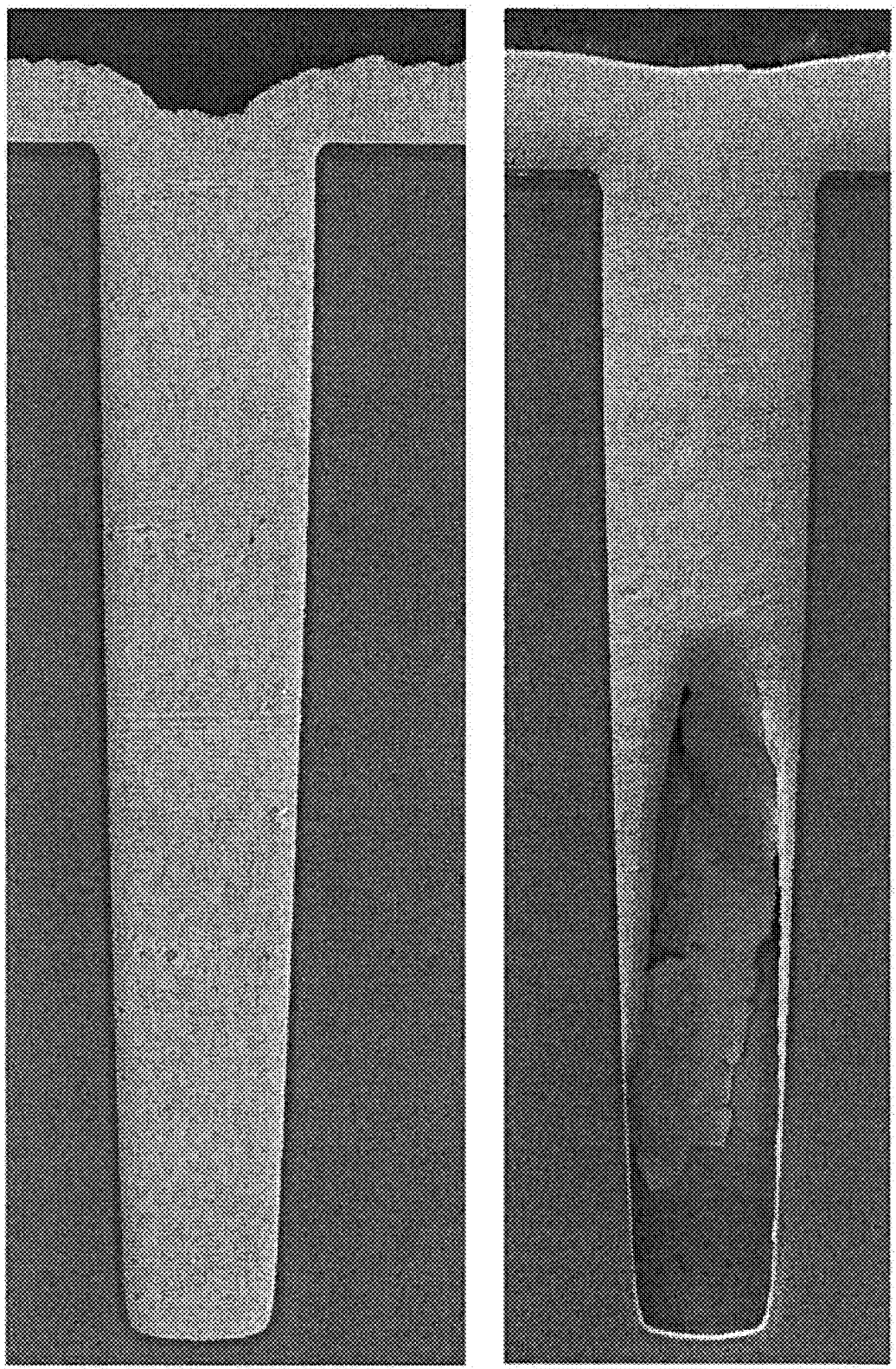
FIG. 8 is a comparison illustration showing filling of 10 micron diameter 50 micron deep TSVs with copper using a plating time of 18 minutes.

FIG. 8 shows the complete filling of a 50 micron deep 10 micron diameter TSV structure in a process time of 18 minutes. Plating was performed at 65 C in a solution containing 60 g/L copper, 10 g/L acid, 50 mg/L chloride ion, and additive concentrations of 2.5 ml/L Viaform Accelerator, 7 ml/L Viaform Extreme Suppreessor, and 12 ml/L Viaform Leveler. While the example does not exhibit the lack of copper growth on the wafer field seen using solutions which rapidly etch copper, the high temperature, high copper concentration, and additive concentrations which yield preferential growth in the via all contribute to allow rapid void-free filling. As a reference, the poor fill result obtained using a process time of 40 minutes with a 25 C process temperature and a 40 g/L copper solution is also shown. The large void in the feature results due to depletion of cupric in the feature even with the lower current and longer process time due to the slow diffusion of cupric ion and its lower initial concentration. Similarly, if additive concentrations are altered from the relatively high ratios of suppressing and leveling components relative to accelerating components used in FIG. 8, large voids in the features result due to a lack of preferential growth in the feature.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method of plating a through silicon via for connecting at least two integrated circuits, wherein the through silicon via has a diameter of at least about 3 micrometers and a depth of at least about 20 micrometers, the method comprising:
    contacting a structure having a through silicon via hole with a plating solution having copper ions at a concentration of at least about 40 grams per liter and chloride ions at a concentration of no greater than about 2 ppm; and
    while contacting the structure, plating copper into the through silicon via hole to completely fill the through silicon via hole in a substantially void free manner,
    wherein a deposition rate during the plating is higher at the bottom of the through silicon via hole than near the opening of the through silicon via hole,
    wherein there is substantially no net deposition of copper onto field regions of the structure between a plurality of through silicon via holes while plating copper.

2. The method of claim 1, wherein the through silicon via is completely filled in less than about 20 minutes.

3. The method of claim 1, wherein the through silicon via has a diameter of between about 3 and 100 micrometers and a depth of between about 20 and 200 micrometers.

4. The method of claim 1, wherein the through silicon via has a diameter of between about 5 and 20 micrometers and a depth of between about 40 and 150 micrometers.

5. The method of claim 1, wherein the through silicon via has an aspect ratio of between about 3:1 to 10:1.

6. The method of claim 1, wherein the concentration of the copper ions in the plating solution is between about 40 grams per liter and 200 grams per liter.

7. The method of claim 1, wherein the concentration of the copper ions in the plating solution is between about 60 grams per liter and 100 grams per liter.

8. The method of claim 1, wherein the plating solution further comprises an oxidizing agent and wherein the oxidizing agent oxidizes the plated copper on a wafer field at a rate of between about 200 Å/minute and 3000 Å/minute when a current is not applied to the wafer.

9. The method of claim 8, wherein the oxidizing agent comprises a hydrogen peroxide solution.

10. The method of claim 9, wherein the hydrogen peroxide solution comprises 30% hydrogen peroxide by weight and the concentration of the hydrogen peroxide solution in the plating solution is between about 0.0025 ml per liter and 50 ml per liter.

11. The method of claim 8, wherein the oxidizing agent comprises elemental oxygen.

12. The method of claim 11, wherein the concentration of the elemental oxygen is between about 1 mg per liter and 20 mg per liter.

13. The method of claim 12, wherein the concentration of the elemental oxygen is between about 1 mg per liter and 5 mg per liter.

14. The method of claim 8, wherein the oxidizing agent comprises cerium ions.

15. The method of claim 8 wherein the oxidizing agent comprises iron ions.

16. The method of claim 15, wherein the concentrations of the iron ions in different oxidation states are in equilibrium and wherein such equilibrium is maintained by reaction at an inert anode.

17. The method of claim 8, wherein the plating solution further comprising a reducing agent, wherein the reducing agent has a concentration gradient in the through silicon via hole and wherein the reducing agent impacts oxidation of the copper.

18. The method of claim 1, wherein a source of the copper ions comprises a copper salt selected from the group consisting of copper methane sulfonate, copper sulfate, copper pyrophosphate, copper propanesulfonate, and combination of thereof.

19. The method of claim 1, wherein the copper ions have a transference number of at least about 0.2 in the plating solution while plating copper into the through silicon via hole.

20. The method of claim 1, wherein the copper ions have a transference number of at least about 0.4 in the plating solution while plating copper into the through silicon via hole.

21. The method of claim 1, wherein the plating solution is maintained at a temperature of between about 40° C. and 75° C. for at least a fraction of the time while plating copper into the through silicon via hole.

22. The method of claim 1, wherein the plating solution is maintained at least about a room temperature for at least a fraction of the time while plating copper into the through silicon via hole.

23. The method of claim 1, wherein the plating solution is substantially free of chloride ions.

24. The method of claim 1, further comprising pretreating a seed layer deposited onto the structure prior to the plating.

25. The method of claim 24, wherein the pretreating is performed using one or more liquids selected from the group consisting of water, a dilute acidic solution, a dilute basic solution, a surfactant containing solution, and the plating solution.

26. The method of claim 1, wherein the structure is a wafer on which at least one of the integrated circuits is fabricated.

27. The method of claim 1, wherein the plating solution has a pH of between about 2 and 6.

28. A method of plating a through silicon via for connecting at least two integrated circuits, wherein the through silicon via has a diameter of at least about 3 micrometers and a depth of at least about 20 micrometers, the method comprising:

pretreating a seed layer deposited onto a structure;
contacting the structure having a through silicon via hole with a plating solution having a copper ions at a concentration of between about 60 gram per liter and 100 gram per liter and chloride ions at a concentration of no greater than about 2 ppm; and
while contacting the structure, plating copper into the through silicon via hole to completely fill the through silicon via hole in a substantially void free manner,
wherein there is substantially no net deposition of copper onto field regions of the structure between a plurality of through silicon via holes while plating copper, and wherein a deposition rate during the plating is higher at the bottom of the through silicon via hole than near the opening of the through silicon via hole.

29. A copper plating solution for depositing copper in a through silicon via for connecting at least two integrated circuits, wherein the through silicon via has a diameter of at least about 3 micrometers and a depth of at least about 20 micrometers, the copper plating solution comprising:
   copper ions at a concentration of at least about 40 grams per liter;
   sulfuric acid;
   an oxidizing agent for oxidizing the deposited copper on a wafer field at a rate of between about 200 Å/minute and 3000 Å/minute when a current is not applied to wafer, the oxidizing agent comprises one or more types of ions selected from the group consisting of: cerium ions and iron ions; and
   chloride ions at a concentration of no greater than about 2 ppm.

30. A method of plating a through silicon via for connecting at least two integrated circuits, wherein the through silicon via has a diameter of at least about 3 micrometers and a depth of at least about 20 micrometers, the method comprising:
   contacting a structure having a through silicon via hole with a plating solution having copper ions at a concentration of at least about 40 grams per liter, chloride ions at a concentration of no greater than about 2 ppm, and an oxidizing agent for oxidizing deposited copper on a wafer field at a rate of between about 200 Å/minute and 3000 Å/minute when a current is not applied to wafer, the oxidizing agent comprises one or more types of ions selected from the group consisting of: cerium ions and iron ions; and
   while contacting the structure, plating copper into the through silicon via hole to completely fill the through silicon via hole in a substantially void free manner,
   wherein a deposition rate during the plating is higher at the bottom of the through silicon via hole than near the opening of the through silicon via hole.

31. The method of claim 30, wherein the oxidizing agent comprises cerium ions.

32. The method of claim 30, wherein the oxidizing agent comprises iron ions.

33. A method of plating a through silicon via for connecting at least two integrated circuits, wherein the through silicon via has a diameter of at least about 3 micrometers and a depth of at least about 20 micrometers, the method comprising:
   contacting a structure having a through silicon via hole with a plating solution having:
      copper ions at a concentration of at least about 40 grams per liter,
      chloride ions at a concentration of no greater than about 2 ppm,
      an oxidizing agent for oxidizing deposited copper on a wafer field at a rate of between about 200 Å/minute and 3000 Å/minute when a current is not applied to wafer, and
      a reducing agent having a concentration gradient in the through silicon via hole, wherein the reducing agent impacts oxidation of the copper; and
   while contacting the structure, plating copper into the through silicon via hole to completely fill the through silicon via hole in a substantially void free manner,
   wherein a deposition rate during the plating is higher at the bottom of the through silicon via hole than near the opening of the through silicon via hole.

* * * * *